United States Patent
Hayashi

(10) Patent No.: US 8,223,135 B2
(45) Date of Patent: Jul. 17, 2012

(54) TOUCH PANEL

(75) Inventor: Yasuhiko Hayashi, Fukui (JP)

(73) Assignee: Panasonic Corporation, Osaka (JP)

( * ) Notice: Subject to any disclaimer, the term of this patent is extended or adjusted under 35 U.S.C. 154(b) by 813 days.

(21) Appl. No.: 12/359,566

(22) Filed: Jan. 26, 2009

(65) Prior Publication Data

US 2009/0189872 A1    Jul. 30, 2009

(30) Foreign Application Priority Data

Jan. 28, 2008   (JP) .................................. 2008-016121

(51) Int. Cl.
    *G06F 3/045* (2006.01)

(52) U.S. Cl. ....................................... 345/174; 345/173

(58) Field of Classification Search .................. 345/173, 345/174; 178/18.01, 18.03, 18.05, 18.06, 178/18.07; 439/55, 77, 449, 456, 457, 458
    See application file for complete search history.

(56) References Cited

U.S. PATENT DOCUMENTS

| | | | |
|---|---|---|---|
| 7,439,466 B2 * | 10/2008 | Yamaue et al. | 200/512 |
| 7,554,051 B2 * | 6/2009 | Crispin | 200/512 |
| 7,710,406 B2 * | 5/2010 | Fujii et al. | 345/173 |
| 2004/0051699 A1 * | 3/2004 | Tanabe et al. | 345/173 |
| 2007/0132736 A1 * | 6/2007 | Crispin | 345/173 |
| 2007/0182720 A1 * | 8/2007 | Fujii et al. | 345/173 |
| 2007/0267285 A1 * | 11/2007 | Yamaue et al. | 200/512 |
| 2008/0170041 A1 | 7/2008 | Inoue et al. | |

FOREIGN PATENT DOCUMENTS

| | | |
|---|---|---|
| CN | 101075169 | 11/2007 |
| JP | 62-139222 | 6/1987 |
| JP | 7-146745 | 6/1995 |
| JP | 2005-78491 | 3/2005 |
| JP | 2005-275934 | 10/2005 |
| JP | 2005-284604 | 10/2005 |
| JP | 2007-310540 | 11/2007 |

* cited by examiner

*Primary Examiner* — My-Chau T Tran

(74) *Attorney, Agent, or Firm* — Wenderoth, Lind & Ponack, L.L.P.

(57) ABSTRACT

In a touch panel, a rear electrode provided at a rear end of an upper conductive layer is extended so as to surround the circumference of an upper substrate. Derivation sections for applying a voltage are formed at both ends of the rear electrode.

4 Claims, 4 Drawing Sheets

TOUCH PANEL

BACKGROUND OF THE INVENTION

1. Field of the Invention

The present invention relates to a touch panel mainly used for operations of a variety of electronic instruments.

2. Description of the Related Art

Recently, the functionality and diversity of a variety of electronic instruments such as portable phones and car navigation systems are increasing. With these increases, instruments equipped with light-transparent touch panels on the front surfaces of display devices such as liquid display devices are increasing in number. A user switches a variety of functions of the instruments by pressing a touch panel with his or her finger, a pen or the like, while viewing a display of the display device on the back surface through the touch panel.

Such a conventional touch panel is described with reference to FIGS. 4 through 6. It is to be noted that a size is partially enlarged in each of the drawings for the sake of facilitating understanding of the configuration. FIG. 4 shows a sectional view of a conventional touch panel, and FIGS. 5 and 6 are plan views of an upper substrate and a lower substrate of this touch panel, respectively. This touch panel has upper substrate 1, lower substrate 2, upper conductive layer 3, lower conductive layer 4, and wiring substrate 11. It is to be noted that both FIGS. 5 and 6 show the upper surface of wiring substrate 11.

Upper substrate 1 has the shape of a film or a thin plate, and is light-transparent. Lower substrate 2 is also light-transparent. Upper conductive layer 3 is substantially rectangular, formed of indium tin oxide or the like, light-transparent, and formed on the lower surface of upper substrate 1 by etching or the like. In the same manner, lower conductive layer 4 is formed on the upper surface of lower substrate 2.

At the front and rear ends of upper conductive layer 3, front electrode 5 and rear electrode 6 are formed of silver or the like. Further, left electrode 7 and right electrode 8 are formed at the left and right ends of lower conductive layer 4. These electrodes extend to the peripheries of upper conductive layer 3 and lower conductive layer 4, and derivation sections 5A, 6A, 7A, 8A are provided at the front end of the touch panel.

On the upper surface of lower conductive layer 4, a plurality of dot spacers (not shown) are formed of an insulating resin at prescribed intervals. Furthermore, spacer 9 having a frame shape is provided at the peripheral inner edge of the upper surface of lower substrate 2. Adhesive layer 10 is applied to the upper surface of spacer 9. The periphery of upper substrate 1 and the periphery of lower substrate 2 are attached to each other by adhesive layer 10. In such a manner, upper conductive layer 3 and lower conductive layer 4 are opposed to each other with a prescribed space therebetween.

The rear end of wiring substrate 11 having a film shape is sandwiched between the front end of upper substrate 1 and the front end of lower substrate 2. Wiring patterns 12, 13 are respectively formed on the upper and lower surfaces of wiring substrate 11. The rear ends of wiring patterns 12, 13 are attached to each of derivation sections 5A, 6A, 7A, 8A by an anisotropic conductive adhesive (not shown) obtained by dispersing conductive particles within a synthetic resin, or the like. In such a manner, the touch panel is configured.

This touch panel is arranged on the front surface of a display device such as a liquid crystal display device, and mounted in an electronic instrument. The front ends of wiring patterns 12, 13 of wiring substrate 11 are electrically connected to an electronic circuit (not shown) of the instrument by means of connectors, soldering, or the like.

In the above configuration, when the user presses the upper surface of upper substrate 1 with his or her finger, a pen, or the like in accordance with a display of the display device on the rear surface of the touch panel, upper substrate 1 is bent, and upper conductive layer 3 comes into contact with lower conductive layer 4 at the pressed place. Subsequently, a voltage is sequentially applied from the electronic circuit to the front and rear ends of upper conductive layer 3 via front electrode 5 and rear electrode 6, and to the left and right ends of lower conductive layer 4 via left electrode 7 and right electrode 8, through wiring patterns 12, 13 of wiring substrate 11. With a ratio of these voltages, the electronic circuit detects the pressed place, and a variety of functions of the instrument are switched.

Namely, for example, with a plurality of menus in the state of being displayed on the display device of the rear surface of the touch panel, the user presses the upper surface of upper substrate 1 on a desired menu. The electronic circuit then detects the pressed (operated) position through wiring patterns 12, 13 of wiring substrate 11. With such an operation, the user can select a desired menu from the plurality of menus.

In the case of detecting the operated position in the manner as thus described, the electronic circuit typically applies a voltage of approximately DC 3 to 5 V between the front and rear ends of upper conductive layer 3 and between the left and right ends of lower conductive layer 4. However, at the time of supplying a current to front electrode 5, rear electrode 6, left electrode 7 and right electrode 8, especially in the electrode with long extended portion, voltage drop occurs due to the resistance thereof, and hence differences in voltage value occur among each electrode.

This situation is described with reference to rear electrode 6 shown in FIG. 5. Rear electrode 6 is extended from the rear end of upper conductive layer 3 to the left end of upper substrate 1, and further extended to the front end of upper substrate 1. Therefore, rear electrode 6 is longer than the other electrodes. For example, voltage drop at a point A near derivation section 6A is 0.1 V. However, voltage drop is 0.15 V at a point B and 0.2 V at a point C. In other words, voltage drop is larger as the point is more distant from derivation section 6A. When a difference in voltage value occurs in a long electrode due to voltage drop, an error occurs in detection of an operated position.

SUMMARY OF THE INVENTION

The present invention is a touch panel capable of suppressing an error in detection of an operated position due to the length of an electrode, to reliably perform an operation. The touch panel of the present invention has light-transparent upper and lower substrates. An upper conductive layer is formed on the lower surface of the upper substrate. A lower conductive layer is formed on the upper surface of the lower substrate so as to oppose the upper conductive layer with a prescribed space held therefrom. A front electrode is provided at a first end of the upper conductive layer and extended to the first end side, and at an end of the front electrode, a first derivation section is formed. A rear electrode is provided at a second end opposite the first end so as to surround the circumference of the upper substrate. The rear electrode is extended to the first end side, and a second derivation section and a third derivation section are formed at both ends of the rear electrode. A left electrode is provided on the lower conductive layer at a third end in a direction perpendicular to a direction linking the first end and the second end of the upper conductive layer. The left electrode is extended to the first end side, and a fourth derivation section is formed at an end of the left electrode. A right electrode is provided on the lower conductive layer at a fourth end opposite the third end. The right electrode is extended to the first end side, and a fifth derivation section is formed at an end of the right electrode.

As thus described, applying or detecting a voltage through the second derivation section and the third derivation section at both ends of the rear electrode provided on the upper conductive layer reduces voltage drop that occurs due to resistance of the electrode. Hence a detection error in this touch panel is reduced, enabling a reliable operation.

DETAILED DESCRIPTION OF THE INVENTION

Figure 1:
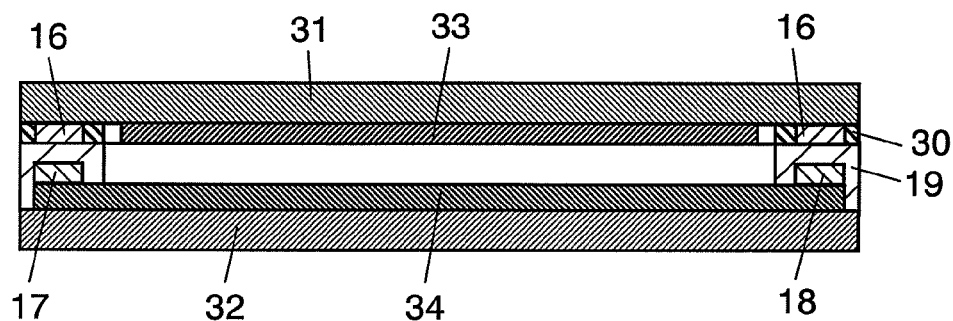
FIG. 1 is a sectional view of a touch panel according to an embodiment of the present invention.
Figure 2:
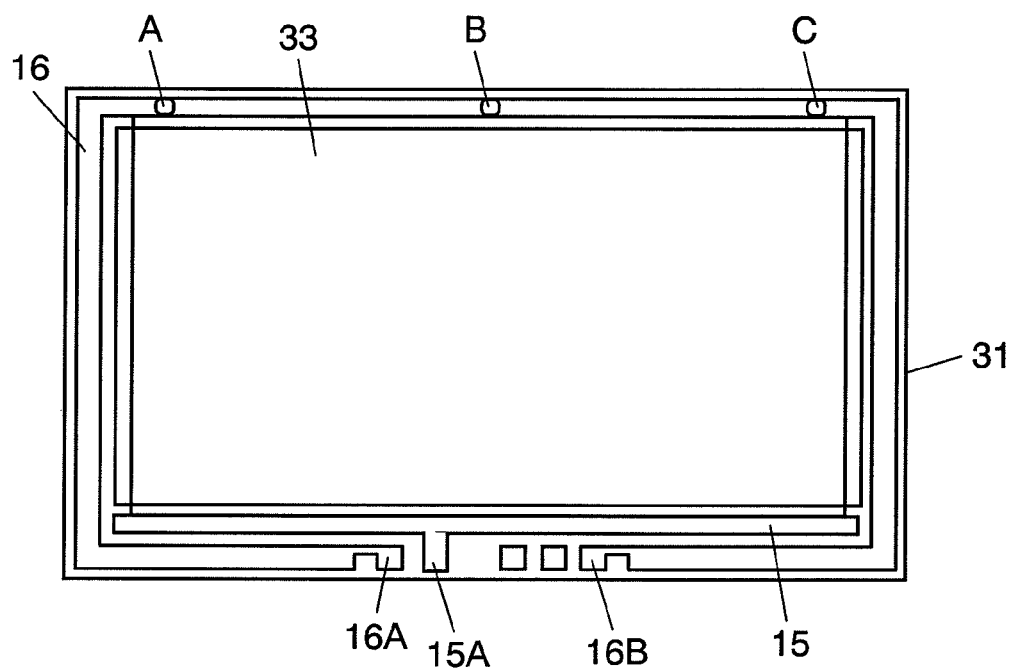
FIG. 2 is a plan view of an upper substrate of the touch panel shown in FIG. 1.
Figure 2:
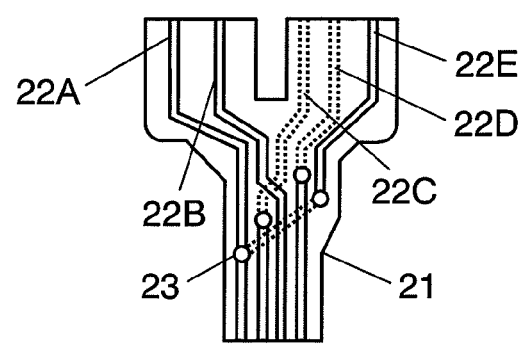
Figure 3:
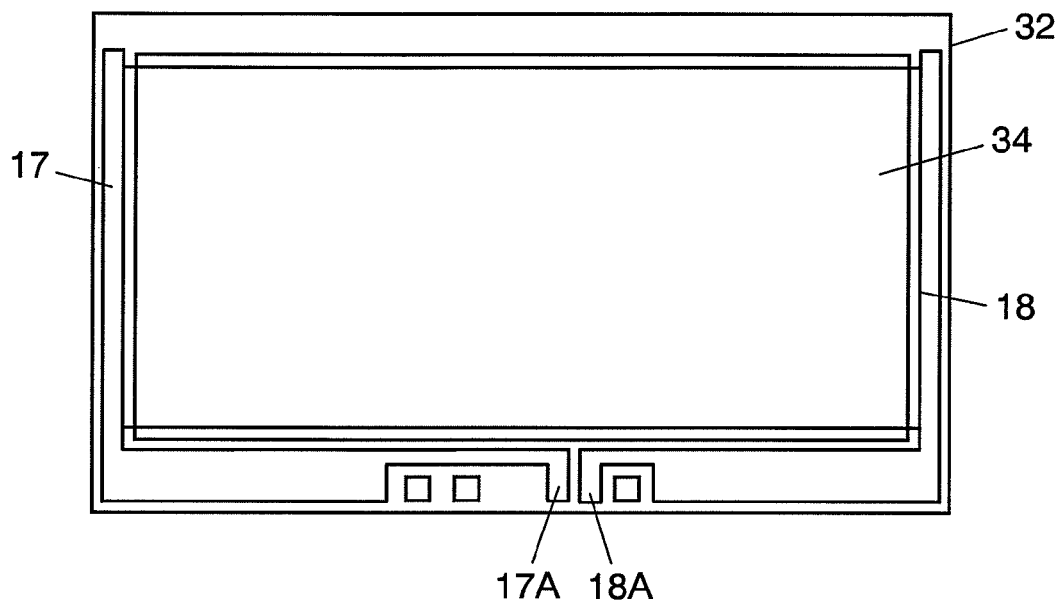
FIG. 3 is a plan view of a lower substrate of the touch panel shown in FIG. 1.
Figure 3:
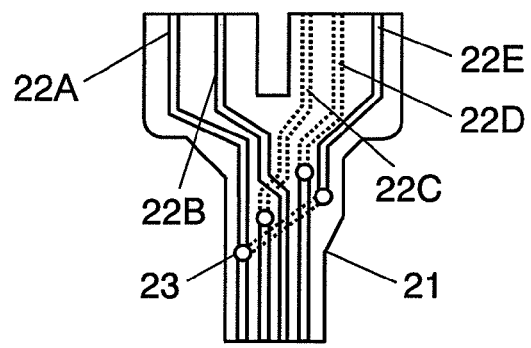
Figure 4:
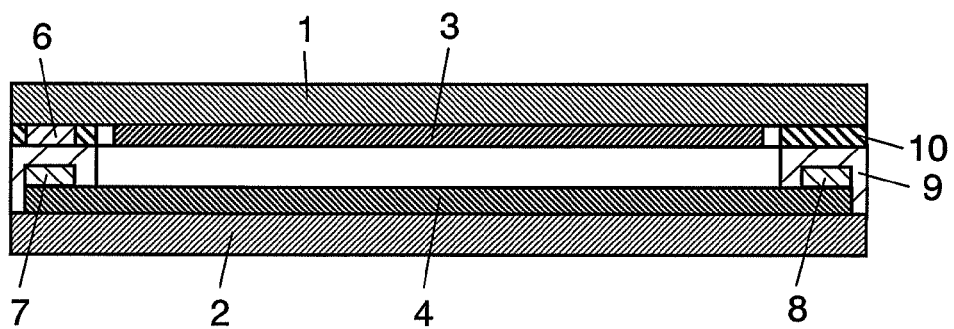
FIG. 4 is a sectional view of a conventional touch panel.
Figure 5:
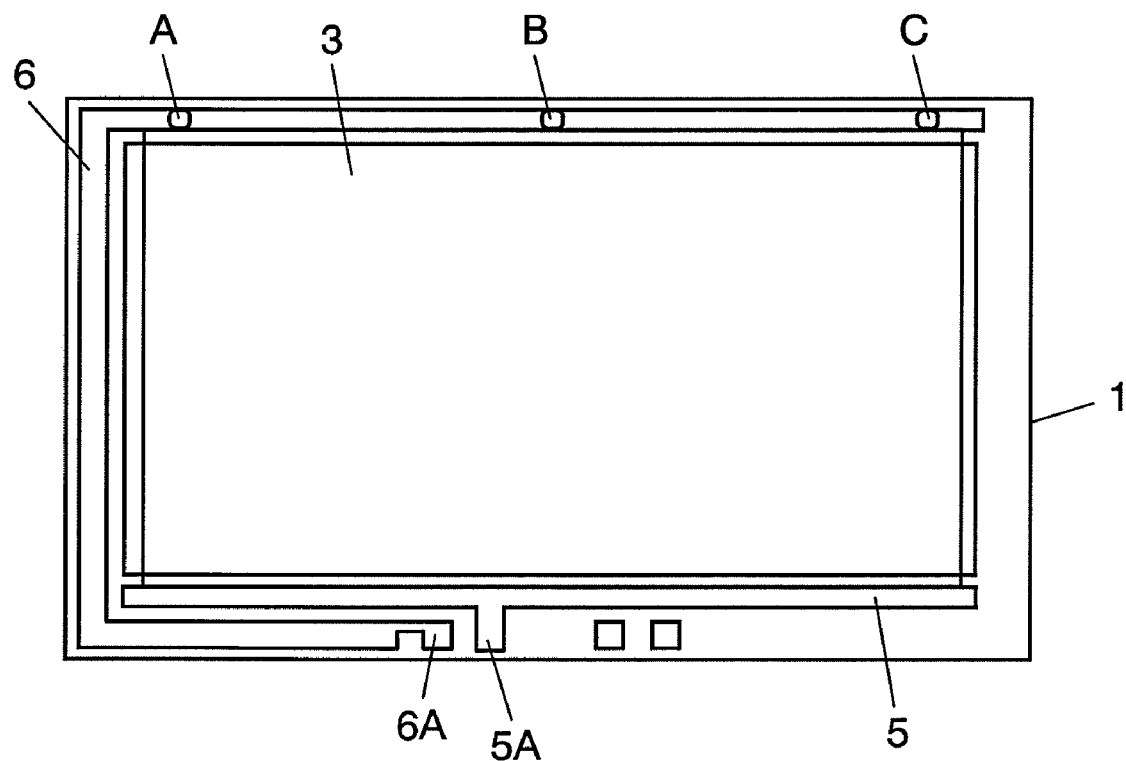
FIG. 5 is a plan view of an upper substrate of the touch panel shown in FIG. 4.
Figure 5:
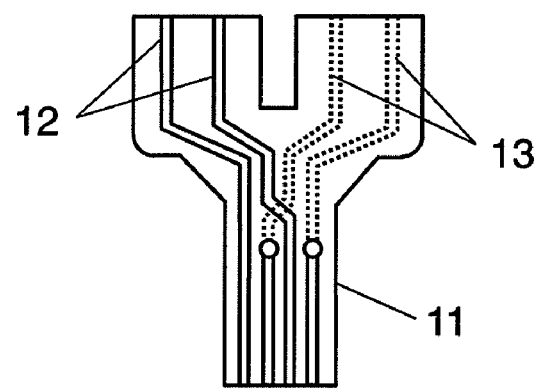
Figure 6:
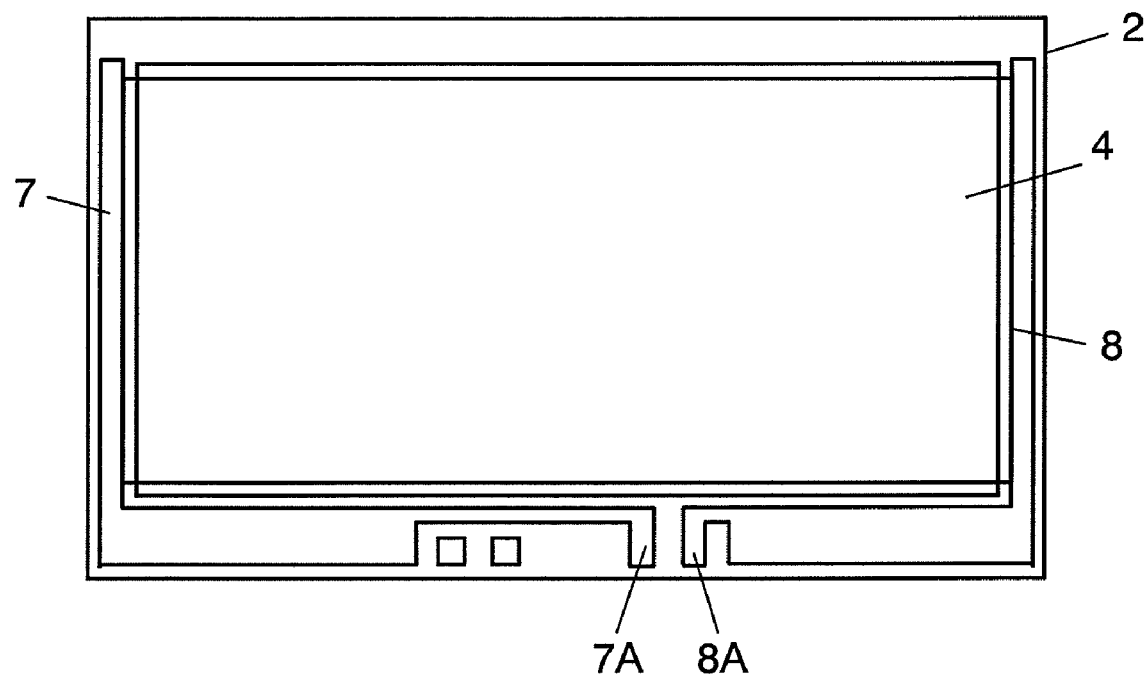
FIG. 6 is a plan view of a lower substrate of the touch panel shown in FIG. 4.
Figure 6:
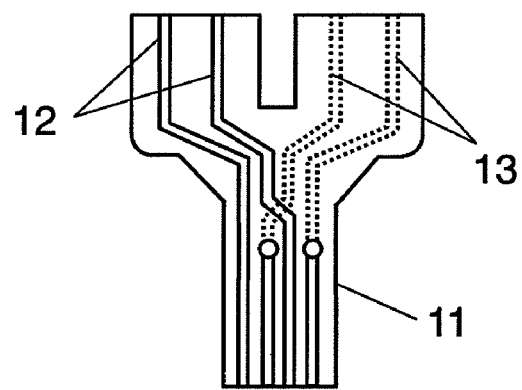

FIG. 1 is a sectional view of a touch panel according to an embodiment of the present invention, and FIGS. 2 and 3 are plan views of an upper substrate and a lower substrate of this touch panel, respectively. This touch panel has upper substrate 31, lower substrate 32, upper conductive layer 33, lower conductive layer 34, and wiring substrate 21. It is to be noted that both FIGS. 2 and 3 show the upper surface of wiring substrate 11.

Upper substrate 31 is configured of a film made of polyethylene terephthalate, polycarbonate, or the like, or a thin plate made of glass or the like, and is light-transparent. Lower substrate 32 is configured in the same manner as upper substrate 31. Light-transparent upper conductive layer 33 is formed of indium tin oxide, tin oxide, or the like in substantially rectangular shape on the lower surface of upper substrate 31. Lower conductive layer 34 is formed on the upper surface of lower substrate 32 in the same manner as in the case of upper conductive layer 33.

Front electrode 15 is formed at the front end (a first end) of upper conductive layer 33, and rear electrode 16 is formed at the rear end (a second end) opposite the front end of upper conductive layer 33. Front electrode 15 has a T-shape, and the front end thereof is provided with derivation section 15A as a first derivation section. Rear electrode 16 has a C-shape, and is extended to almost the circumference of upper substrate 31 so as to surround the peripheral inner rim thereof. The left and right ends of rear electrode 16 are provided with derivation section 16A as a second derivation section and derivation section 16B as a third derivation section, respectively.

Furthermore, left electrode 17 is formed at the left end of lower conductive layer 34, and right electrode 18 is formed at the right end. The left end is a third end in a direction perpendicular to the shared direction of the front end and rear end of upper conductive layer 33, and the right end is a fourth end opposite the left end. Left electrode 17 and right electrode 18 have an L-shape. The front end (first end side) of left electrode 17 is provided with derivation section 17A as a fourth derivation section, and the front end (first end side) of right electrode 18 is provided with derivation section 18A as a fifth derivation section. Front electrode 15, rear electrode 16, left electrode 17, and right electrode 18 are formed of silver or carbon.

On the upper surface of lower conductive layer 34, a plurality of dot spacers (not shown) are formed of an insulating resin made of epoxy, silicon, or the like, at prescribed intervals. The peripheral inner rim of the upper surface of lower substrate 32 is provided with spacer 19 having a frame shape and made of polyester, epoxy, or the like. On the upper surface of spacer 19, adhesive layer 30 is formed of made of acryl, rubber, or the like. The periphery of upper substrate 31 and the periphery of lower substrate 32 are attached to each other by adhesive layer 30. In such a manner, upper conductive layer 33 faces lower conductive layer 34 with a prescribed space held therebetween.

Wiring substrate 21 is formed of a film made of polyimide, polyethylene terephthalate or the like. The rear end of wiring substrate 21 is sandwiched between the front end of upper substrate 31 and the front end of lower substrate 32. Wiring patterns 22A to 22E are formed on the upper and lower surfaces of wiring substrate 21, respectively. Wiring patterns 22A, 22B, 22E, 22C, 22D are first, second, third, fourth and fifth wiring patterns, respectively. The wiring patterns 22A to 22E are formed of an anisotropic conductive adhesive (not shown) or the like. The adhesive is obtained by dispersing conductive particles prepared by gold-plating nickel, a resin, or the like, within a synthetic resin made of epoxy, acryl, polyester or the like. The rear ends of wiring patterns 22A to 22E are adhesively connected to derivation sections 16A, 15A, 17A, 18A, 16B, respectively.

Among them, wiring pattern 22E is connected to derivation section 16B of rear electrode 16. Wiring pattern 22E is connected to wiring pattern 22A which is connected to derivation section 16A of rear electrode 16 by through-hole electrode 23 or the like. Through-hole electrode 23 is formed by filling a through hole with silver or the like. In such a manner, the touch panel is configured.

At the time of producing such a touch panel, upper substrate 31 and lower substrate 32, each having a conductive layer formed on whole of one surface thereof, are prepared. This conductive layer is formed of indium tin oxide or the like by sputtering or the like. Subsequently, places where upper conductive layer 33 on the lower surface of upper substrate 31 and lower conductive layer 34 on the upper surface of lower substrate 32 are formed are coated with a synthetic resin or the like, to form masking films. Thereafter, these are immersed into a prescribed solution and etched, to remove places of the conductive layers other than the masked places. The masking films are then peeled and cleaned by water washing or the like. In such a manner, upper substrate 31 with upper conductive layer 33 formed thereon and the lower substrate 32 with lower conductive layer 34 formed thereon are produced.

Subsequently, front electrode 15 and rear electrode 16, and left electrode 17 and right electrode 18, which are made of silver, carbon, or the like, are formed on upper substrate 31 and lower substrate 32 by screen-printing, respectively. Furthermore, the dot spacers and spacer 19 are formed on the upper surface of lower conductive layer 34 by screen-printing or the like. Thereafter, an adhesive is applied to the upper surface of spacer 19, forming adhesive layer 30.

On the other hand, a sheet in a film shape with copper foils attached on both surfaces thereof is prepared. This sheet is then etched to form wiring patterns 22A to 22E on the upper and lower surfaces. Or, screen-printing or the like is performed on a sheet in a film shape, forming wiring patterns 22A to 22E. Thereafter, through-hole electrode 23 or the like is formed according to need, and an outer shape is cut, thus producing wiring substrate 21.

Moreover, upper substrate 31 and lower substrate 32 are attached to each other by adhesive layer 30. At this time, the rear end of wiring substrate 21 is sandwiched between the front end of upper substrate 31 and the front end of lower substrate 32, and the rear ends of wiring patterns 22A to 22E are adhesively connected to derivation sections 16A, 15A, 17A, 18A, 16B, respectively. In such a manner, the touch panel is completed.

In addition, when an adhesive made of acryl, silicone or the like is applied to the place where the rear end of wiring substrate 21 is sandwiched between the front end of upper substrate 31 and the front end of lower substrate 32, wiring substrate 21 can be more firmly held.

The touch panel configured as thus described is arranged on the front surface of a display device such as a liquid crystal display device, and mounted in an electronic instrument. The front ends of wiring patterns 22A to 22E of wiring substrate 21 are electrically connected to an electronic circuit (not shown) of the instrument by means of connectors, soldering, or the like.

In the above configuration, when the user presses the upper surface of upper substrate 31 with his or her finger, a pen, or the like in accordance with a display of the display device on the rear surface of the touch panel, upper substrate 31 is bent, and upper conductive layer 33 comes into contact with lower conductive layer 34 at the pressed place.

A voltage is then applied to the front and rear ends of upper conductive layer 33 via front electrodes 15 and back electrode 16 through wiring patterns 22A to 22E of wiring substrate 21 from the electronic circuit. Subsequently, a voltage is applied to the left and right ends of lower conductive layer 34 via left electrode 17 and right electrode 18. Based upon a ratio of these voltages, the electronic circuit detects the pressed place, and a variety of functions of the instrument are switched.

Namely, for example, with a plurality of menus in the state of being displayed on the display device of the rear surface of the touch panel, the user presses the upper surface of upper substrate 31 on a desired menu. The electronic circuit then detects a position where this operation is performed through wiring patterns 22A to 22E of wiring substrate 21. With such an operation, the user can select a desired menu from the plurality of menus.

In the case of detecting the pressed (operated) position in the manner as thus described, the electronic circuit typically applies a voltage of approximately DC 3 to 5 V between the front and rear ends of upper conductive layer 33 and between the left and right ends of lower conductive layer 34. At the time of supplying a current to front electrode 15, rear electrode 16, left electrode 17 and right electrode 18, voltage drop occurs due to the resistance of these electrodes.

In the present embodiment, rear electrode 16 of the longest size is formed in a C-shape, and extended from the rear end of upper conductive layer 33 to substantially the circumference of upper substrate 31 so as to surround the peripheral inner rim thereof. Since the voltage is applied or detected through derivation sections 16A, 16B at both ends of rear electrode 16, voltage drop in rear electrode 16 is reduced. Moreover, since wiring pattern 22A and wiring pattern 22E are conducted, derivation sections 16A, 16B are also conducted. Hence voltage drop in rear electrode 16 is reduced.

For example, when voltage drop at a point A near derivation section 16A shown in FIG. 2 is 0.1 V, voltage drop at a point C near derivation section 16B is also 0.1 V. Meanwhile, voltage drop at a point B most distant from derivation sections 16A, 16B is 0.15 V. A voltage drop larger than this will not occur.

Namely, when the electronic circuit applies or detects a voltage from wiring pattern 22A and a voltage from wiring pattern 22E connected to wiring pattern 22A, a place most distant from derivation sections 16A and 16B at both ends are neither the point A nor the point C, but the point B at the middle section of rear electrode 16. Therefore, voltage drop that occurs due to the resistance of rear electrode 16 is reduced, thereby enabling a reliable operation with a small error. Furthermore, the wiring on wiring substrate 21 is not complex because wiring patterns 22A, 22E are conducted to each other via through-hole electrode 23.

As described above, according to the present embodiment, rear electrode 16 provided at the rear end of upper conductive layer 33 is extended in C-letter shape so as to surround substantially the circumference of upper substrate 31. Derivation sections 16A, 16B are formed at both ends of rear electrode 16. Detecting or applying voltages through these both ends reduces voltage drop that occurs due to resistance of rear electrode 16. Therefore, a measurement error is reduced, thereby enabling a reliable operation.

Although the configuration formed by etching upper conductive layer 33 and lower conductive layer 34 is described in the above description, the present invention is not restricted to this. A conductive layer made of indium tin oxide or the like may be formed on each of the whole lower surface of upper substrate 31 and on the whole upper surface of lower substrate 32, and a slit which removes parts of the conductive layer therefrom may be provided by laser-cutting. This slit can prevent a short circuit between each electrode or with a dummy pattern or the like. The present invention can also be performed even when a configuration is formed so as to hold insulation between each electrode or with the dummy pattern or the like.

As thus described, the touch panel according to the present invention is capable of reliable operation with a small detection error, and thus useful for operations in a variety of electronic instruments.

What is claimed is:

1. A touch panel comprising:
a light-transparent upper substrate;
an upper conductive layer formed on a lower surface of the upper substrate;
a lower conductive layer facing the upper conductive layer with a prescribed space held therefrom;
a light-transparent lower substrate, the lower conductive layer being formed on an upper surface thereof;
a front electrode provided at a first end of the upper conductive layer, including a first derivation section extending from the front electrode toward a first end side of the upper substrate;
a rear electrode provided on the upper conductive layer at a second end opposite the first end and extending toward the first end side so as to surround a circumference of the upper substrate, and including a second derivation section and a third derivation section being formed at both ends, respectively, of the rear electrode;
a left electrode provided on the lower conductive layer at a third end in a direction perpendicular to a direction of the first end and the second end of the upper conductive layer, and including a fourth derivation section at an end of the left electrode and extending toward the first end side; and
a right electrode provided on the lower conductive layer at a fourth end opposite the third end, and including a fifth derivation section at an end of the right electrode and extending toward the first side.

2. The touch panel according to claim 1, further comprising a wiring substrate sandwiched between the upper substrate and the lower substrate, wherein a first wiring pattern connected to the second derivation section, a second wiring pattern connected to the first derivation section and a third wiring pattern connected to the third derivation section are formed on a front surface of the wiring substrate, and a fourth wiring pattern connected to the fourth derivation section and a fifth wiring pattern connected to the fifth derivation section are formed on a lower surface of the wiring substrate.

3. The touch panel according to claim 2, wherein the first wiring pattern and the third wiring pattern are conducted in the wiring substrate.

4. The wiring substrate according to claim 3, wherein the wiring substrate has a through-hole electrode connecting the first wiring pattern and the third wiring pattern.

* * * * *